United States Patent
Chakravorty et al.

(10) Patent No.: US 6,963,483 B2
(45) Date of Patent: Nov. 8, 2005

(54) SELF-ALIGNED COAXIAL VIA CAPACITORS

(75) Inventors: Kishore K. Chakravorty, San Jose, CA (US); Thomas S. Dory, Gilbert, AZ (US); C. Michael Garner, Pleasanton, CA (US)

(73) Assignee: Intel Corporation, Santa Clara, CA (US)

(*) Notice: Subject to any disclaimer, the term of this patent is extended or adjusted under 35 U.S.C. 154(b) by 366 days.

(21) Appl. No.: 10/386,981

(22) Filed: Mar. 12, 2003

(65) Prior Publication Data

US 2003/0168342 A1 Sep. 11, 2003

Related U.S. Application Data

(62) Division of application No. 09/474,186, filed on Dec. 29, 1999, now Pat. No. 6,565,730.

(51) Int. Cl.[7] .............................................. H01G 4/228
(52) U.S. Cl. ................... 361/306.3; 361/313; 29/25.41; 257/303; 257/306
(58) Field of Search ..................... 361/306.3, 311–313, 361/321.2, 321.3, 321.4, 329; 257/295–300, 306–311; 29/25.41

(56) References Cited

U.S. PATENT DOCUMENTS

| | | | | |
|---|---|---|---|---|
| 3,191,098 A | | 6/1965 | Fuller ......................... 317/101 |
| 4,453,199 A | * | 6/1984 | Ritchie et al. ........... 361/306.1 |
| 5,071,521 A | | 12/1991 | Kojima et al. .............. 205/153 |
| 5,120,572 A | | 6/1992 | Kumar ......................... 437/60 |
| 5,219,787 A | | 6/1993 | Carey et al. ................. 437/187 |
| 5,583,739 A | * | 12/1996 | Vu et al. ..................... 361/313 |
| 5,745,334 A | | 4/1998 | Hoffarth et al. ............ 361/313 |
| 5,765,279 A | | 6/1998 | Moresco et al. .............. 29/840 |
| 5,872,696 A | | 2/1999 | Peters et al. ................. 361/305 |
| 5,872,697 A | | 2/1999 | Christensen et al. ........ 361/313 |
| 5,972,053 A | | 10/1999 | Hoffarth et al. ........... 29/25.03 |
| 5,973,910 A | * | 10/1999 | Gardner ...................... 361/313 |
| 6,218,255 B1 | | 4/2001 | Fritzinger et al. .......... 438/386 |
| 6,323,537 B1 | | 11/2001 | Fritzinger et al. .......... 257/532 |

FOREIGN PATENT DOCUMENTS

| | | | |
|---|---|---|---|
| DE | 19826189 | 12/1999 | ............ H01G/4/33 |
| GB | 2161988 | 1/1986 | ............ H05K/3/42 |
| JP | 01216591 | 8/1989 | ............ H05K/1/16 |
| JP | 03252193 | 11/1991 | ............ H05K/1/16 |
| JP | 10163632 | 6/1998 | ............ H05K/3/46 |

* cited by examiner

Primary Examiner—Anthony Dinkins
(74) Attorney, Agent, or Firm—Schwegman, Lundberg, Woessner & Kluth, P.A.

(57) ABSTRACT

The various embodiments of coaxial capacitors are self-aligned and formed in a via, including blind vias, buried vias and plated through holes. The coaxial capacitors are adapted to utilize the plating of a plated via as a first electrode. The dielectric layer is formed to overlie the first electrode while leaving a portion of the via unfilled. A second electrode is formed in the portion of the via left unfilled by the dielectric layer. Such coaxial capacitors are suited for use in decoupling and power dampening applications to reduce signal and power noise and/or reduce power overshoot and droop in electronic devices. For such applications, it is generally expected that a plurality of coaxial capacitors, often numbering in the thousands, will be coupled in parallel in order to achieve the desired level of capacitance.

36 Claims, 5 Drawing Sheets

SELF-ALIGNED COAXIAL VIA CAPACITORS

This application is a divisional of U.S. patent application Ser. No. 09/474,186, filed Dec. 29, 1999 now U.S. Pat. No 6,565,730, which is incorporated herein by reference.

TECHNICAL FIELD OF THE INVENTION

The invention relates generally to capacitors, and more particularly to self-aligned coaxial capacitors formed in vias, apparatus utilizing such capacitors, and methods of their fabrication.

BACKGROUND OF THE INVENTION

Electronic circuits, and particularly computer and instrumentation circuits, have in recent years become increasingly powerful and fast. As circuit frequencies exceed several hundred megahertz (MHz), with the associated spectral components exceeding 10 gigahertz (GHz), noise in the DC power and ground lines increasingly becomes a problem. This noise can arise due to inductive and capacitive parasitics, for example, as is well known. To reduce such noise, capacitors known as decoupling capacitors are often used to provide a stable signal or stable supply of power to the circuitry. The decoupling capacitors are generally placed as close to the load as practical to increase their effectiveness.

Capacitors are further utilized to dampen power overshoot when an electronic device is powered up, and to dampen power droop when the electronic device begins using power, such as the immediate need for voltage caused by a processor performing a calculation.

Often, the capacitors are surface mounted to the electronic device, such as a processor, or the package substrate on which it is mounted. Other solutions have involved the formation of a planar capacitor integrated on or embedded within a substrate, such as high-density interconnect (HDI) substrates and ceramic multilayer structures. As electronic devices continue to advance, there is an increasing need for higher levels of capacitance for decoupling and power dampening at reduced inductance levels.

At increasingly reduced device sizes and packing densities, available real estate for surface-mounted capacitors becomes a limiting factor. Furthermore, for planar capacitors, increasingly higher capacitance requirements require increasingly large surface area. This increases the risk of shorts or leakage, thus reducing device yield and increasing device reliability concerns.

As will be seen from the above concerns, there exists a need for alternative capacitance solutions in the fabrication and operation of electronic and integrated circuit devices.

SUMMARY OF THE INVENTION

For one embodiment, the invention provides a capacitor. The capacitor includes a via having sidewalls defined by a substrate and extending from a first surface of the substrate to a second surface of the substrate, wherein the first surface extends outwardly from the sidewalls. The capacitor further includes a first electrode overlying the sidewalls of the via and at least a portion of the first surface of the substrate. The capacitor still further includes a dielectric layer formed to overlie at least a first portion of the first electrode and to leave a remaining portion of the via unfilled, wherein the first portion of the first electrode is within the sidewalls. The capacitor still further includes a second electrode formed in the remaining portion of the via.

For another embodiment, the invention provides a method of forming a capacitor. The method includes forming a first electrode layer overlying sidewalls of a via and at least a portion of a first surface of a substrate, wherein the sidewalls of the via are defined by a portion of the substrate extending from the first surface of the substrate to a second surface of the substrate, and wherein the first surface extends outwardly from the sidewalls. The method further includes forming a dielectric layer overlying at least a first portion of the first electrode layer while leaving a portion of the via unfilled, wherein the first portion of the first electrode layer is within the sidewalls. The method still further includes forming a second electrode, wherein forming the second electrode comprises forming a conductive material in the portion of the via left unfilled by the dielectric layer.

For a further embodiment, the invention provides a method of operating an electronic device. The method includes coupling a first electrode for each of a plurality of capacitors to a first potential. The method further includes coupling a second electrode for each of the plurality of capacitors to a second potential. Each of the plurality of capacitors is a self-aligned coaxial capacitor formed in one of a plurality of vias of a substrate supporting the electronic device, and in a one-to-one relationship to the plurality of vias.

For a still further embodiment, the invention provides an electronic device. The electronic device includes a first potential source, a second potential source, and at least one capacitor. The at least one capacitor includes a via having sidewalls defined by a substrate and extending from a first surface of the substrate to a second surface of the substrate, wherein the first surface extends outwardly from the sidewalls. The at least one capacitor further includes a first electrode overlying the sidewalls of the via and at least a portion of the first surface of the substrate. The at least one capacitor still further includes a dielectric layer formed to overlie at least a first portion of the first electrode and to leave a remaining portion of the via unfilled, wherein the first portion of the first electrode is within the sidewalls. The at least one capacitor still further includes a second electrode formed in the remaining portion of the via.

Other embodiments of the invention include methods, apparatus and systems of varying scope.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is, therefore, not to be taken in a limiting sense, and the scope of the invention is defined only by the appended claims and equivalents thereof. Like numbers in the figures refer to like components, which should be apparent from the context of use.

The various embodiments will be described in the context of embedded capacitors for microprocessor package applications. One example of a microprocessor package is that of an integrated circuit semiconductor die mounted to a printed circuit board (PCB), the PCB providing physical support and ancillary circuitry and components facilitating use of the processor contained on the die. However, the invention is not so limited. Those skilled in the art will recognize that the various embodiments of the invention are adapted for use in conjunction with other electronic devices as well as other multi-layer electronic substrates, such as motherboards and other printed circuit boards, high-density interconnect (HDI) substrates and ceramic multilayer structures. Furthermore, the various embodiments describe the fabrication and characterization of the capacitors as substantially cylindrical structures. However, other geometries are suitable for use with the various embodiments provided the mathematical characterizations are modified for the obvious differences in geometry.

Figure 1A:
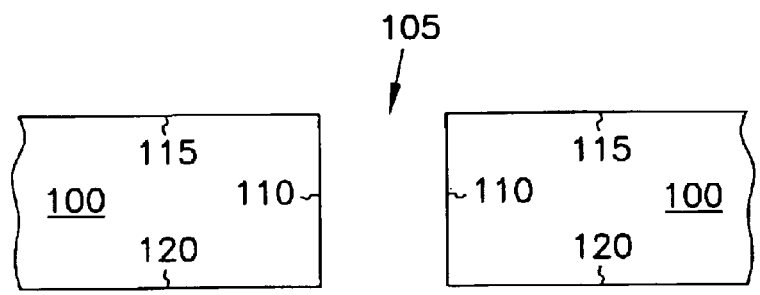
FIGS. 1A–1F are cross-sectional views of a self-aligned coaxial capacitor at various processing stages.

FIG. 1A depicts a via 105. A via is an opening extending through at least one layer of a substrate, and is used to establish electrical interconnection of circuitry on one layer of the substrate to circuitry on an opposing surface of the layer, or to circuitry on one or more other layers of the substrate. A typical via may have a diameter of approximately 150 µm and a length of approximately 25–40 µm when extending through a single layer of substrate 100. Substrate 100 may have more than one layer. A via 105 may be bounded above and/or below by additional layers of a substrate 100. A via bounded on only one end is often termed a blind via. A via bounded on both ends is often termed a buried via. A via extending through all layers of a substrate 100 is often termed a through hole. A typical through hole may have a diameter of approximately 250 µm and a length of approximately 800 µm. While the foregoing examples of via dimensions are considered typical, the various embodiments of the invention are not limited to such dimensions. Furthermore, subsequent exemplary dimensions are likewise not limiting. It is recognized that the trend within industry is to generally reduce device dimensions for the associated cost and performance benefits.

Via 105 has sidewalls 110, defined by the substrate 100 and extending from a first surface 115 of the substrate 100 to a second surface 120 of the substrate 100. Via 105 is formed in a manner known in the art for forming an opening in a substrate. Examples include laser drilling and mechanical drilling. The first surface 115 and second surface 120 extend outwardly from the sidewalls 110.

Figure 1B:
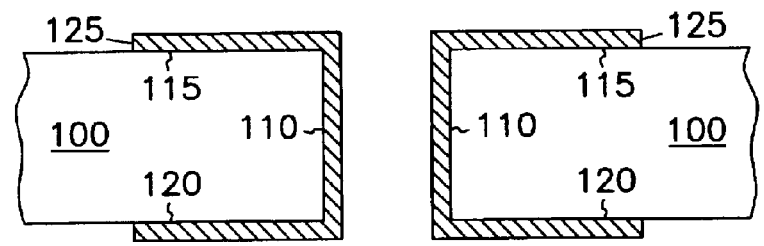

In FIG. 1B, a first electrode 125 is formed overlying the sidewalls 110. For one embodiment, the first electrode 125 further extends to overlie at least a portion of the first surface 115 and at least a portion of the second surface 120. For another embodiment, the first electrode 125 may extend to overlie at least a portion of the first surface 155, but not overlie any portion of the second surface 120. The first electrode 125 is generally formed as part of the standard processing for forming a via 105 and represents the conductive layer used for the interconnect. Upon forming the first electrode 125, the via is generally referred to as a plated via or plated through hole.

In the use of via 105, the first electrode 125 is generally used to connect circuitry on the first surface 115 to circuitry on the second surface 120. In addition, or in the alternative, the first electrode may be used to connect circuitry on the first surface 115 to circuitry on various intermediate layers between the first surface 115 and the second surface 120. For one embodiment, the first electrode 125 contains copper (Cu). Copper is a common plating material used in printed circuit board (PCB) manufacture. The first electrode 125 is formed, in one embodiment, by depositing a seed layer, such as sputter-deposited or electroless-deposited copper, on the substrate 100 followed by electrolytic plating a layer of copper on the seed layer.

For another embodiment, the first electrode 125 is formed using standard photolithographic techniques. Such techniques include patterning a photolithographic mask on a surface of the substrate 100, leaving exposed those portions of the substrate 100 where it is desired to form the first electrode 125. A layer of conductive material is then deposited on the exposed portions by physical or chemical vapor deposition techniques (PVD or CVD), followed by removal of the mask and any overlying deposited material. Other methods of depositing the first electrode will be apparent to those skilled in the art, such as screen printing or other printing of conductive inks.

Figure 1C:
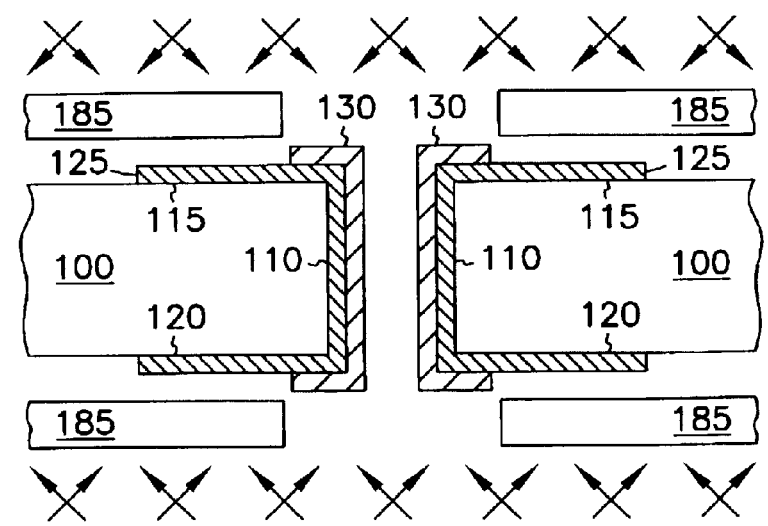

In FIG. 1C, a dielectric layer 130 is formed containing a dielectric material. For one embodiment, the dielectric layer 130 contains a metal oxide, such as tantalum oxide ($Ta_2O_5$). The metal oxide of one embodiment may be formed by sputter depositing from a metal target to form a layer of the metal, and anodizing the layer of the metal in a weak acid electrolyte to form the metal oxide. For one embodiment, the weak acid electrolyte is an organic acid, e.g., citric acid, dilute non-aqueous solution of less than about 5% by weight. Such weak acid electrolytes are expected to result in a film with lower inclusions and, thus, lower stress. The thickness of the oxide can be controlled through the application of a controlled voltage. For example, using a tantalum layer for the formation of the metal oxide, an applied voltage of approximately 60V would result in a thickness of tantalum oxide of approximately 900 angstroms. Remaining non-oxidized metal in the dielectric layer 130 is not a concern as it will reside at the interface between the first electrode 125 and the dielectric layer 130 and thus not adversely affect the resulting capacitance given its conductivity.

Through the use of a shadow mask 185, the layer of metal, such as tantalum, may be deposited by PVD in areas not covered by the shadow mask 185. A shadow mask 185 is a mechanical mask placed on the substrate 100, or in close proximity to the substrate 100, to block or mask areas where deposition is not desired. For one embodiment, the PVD process, such as sputtering, is carried out from both surfaces 115, 120 of the substrate 100 such that dielectric layer 130 is formed to overlie a portion of the first surface 115 as well as a portion of the second surface 120. For another embodiment, the PVD process, such as sputtering, is carried out from only the first surface 115 of the substrate 100 such that dielectric layer 130 is formed to overlie a portion of the first surface 115, but not to overlie a portion of the second surface 120. Alternatively, a metal layer may be deposited by electrolytic plating or photolithographic techniques, and converted to the metal oxide by anodization in a weak acid electrolyte.

In embodiments using anodization or similar reactive processes to form the dielectric layer 130, the underlying first electrode 125 may be vulnerable to attack. It may be advantageous to protect exposed areas of the first electrode 125 from such attack. One example includes applying a protective layer to exposed portions of the first electrode 125, such as a patterned photoresist material, prior to anodization of the dielectric layer 130. Another example includes applying a blanket layer of metal over the first electrode 125 and selectively anodizing only those portions of the blanket layer of metal that define the future dielectric layer 130, such as by using a patterned photoresist material. Following conversion of the metal to its corresponding metal oxide, the protective layer and any overlying material could be removed. In addition, an adhesion layer could be applied to the first electrode 125 prior to formation of the dielectric layer 130, and the adhesion layer could serve to protect exposed portions of the first electrode 125 during formation of the dielectric layer 130.

In addition, the dielectric layer 130 may be formed by RF sputtering from a composite target of a dielectric material, or through reactive sputtering from multiple elemental targets, without the need for anodization or other oxidation techniques. Metal organic CVD (MOCVD) and sol-gel techniques have further been utilized to directly form metal oxide dielectrics. Other techniques of forming layers of dielectric material are known in the art and can include CVD and plasma-enhanced CVD (PECVD). Furthermore, other dielectric materials can be utilized with the various embodiments. Examples of other dielectric materials include strontium titanate ($SrTiO_3$), barium titanate ($BaTiO_3$), barium strontium titanate ($BaSrTiO_3$; BST), lead zirconium titanate ($PbZrTiO_3$; PZT), aluminum oxide ($Al_2O_3$) or zirconium oxide ($Zr_2O_3$), often formed by sputtering from a composite target or by MOCVD. Further examples include more conventional dielectric materials such as silicon dioxide ($SiO_2$), silicon nitride (SiN) and silicon oxynitride ($SiO_xN_y$).

The designer must consider the operating conditions, especially that of temperature, when choosing a deposition technique. Organic substrates typically require processing temperatures below about 250° C. while some of the foregoing deposition techniques may require operating temperatures in excess of about 550° C. As an example, many of the metal oxides having a high dielectric constant, such as the titanates discussed above, utilize a high-temperature densification or annealing process subsequent to deposition in order to obtain their maximum values of dielectric constant. Such densification processes may reach temperatures of approximately 700–1,000° C. and be unsuitable for organic substrates. However, such densification processes would be suitable for substrates having a higher temperature resistance, such as ceramic substrates. In some embodiments, adhesion of the dielectric material to the first electrode 125 may be enhanced through conditioning of the first electrode 125, such as black oxide treatment of a copper electrode. However, such treatment may not be advisable as it will generally roughen the copper surface and may introduce defects in the subsequent dielectric layer.

The dielectric layer 130 is formed to overlie at least a first portion of the first electrode 125, the first portion of the first electrode 125 being that portion within the sidewalls 110. Furthermore, the dielectric layer 130 is formed to leave a remaining portion of the via 105 unfilled. As shown in FIG. 1C, and as previously described for one embodiment, the dielectric layer 130 may extend to overlie a second portion of the first electrode 125 overlying a portion of the first surface 115. Such second portion of the first electrode 125 may further overlie a portion of the second surface 120. Extension of the dielectric layer 130 over the second portion of the first electrode 125 provides certain advantages relating to separation of the first electrode 125 from a subsequent electrode as will become apparent below. However, at least a portion of the first electrode 125 on the first surface 115 remains uncovered by the dielectric layer 130.

Figure 1D:
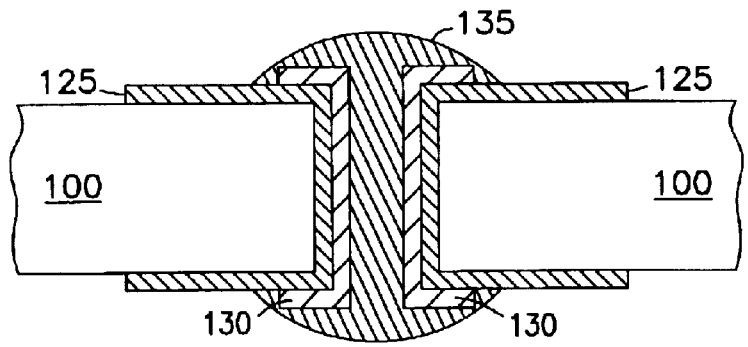

In FIG. 1D, a second electrode 135 is formed in the remaining portion of the via 105 not filled by the dielectric layer 130. The second electrode 135 is formed, in one embodiment, by filling the remaining portion of the via 105 with a conductive paste. For one embodiment, the conductive paste is cured.

Alternatively, electroless plating followed by electrolytic plating of metal, such as copper, can be used for one embodiment to form a layer of electroplated metal overlying the dielectric layer 130 as the second electrode 135. In this embodiment, the second electrode 135 will have generally a hollow structure defined by the structure of the remaining portion of the via 105 left unfilled by the dielectric layer 130, and may completely fill the remaining portion of the via 105. Any portion of the via 105 unfilled by the resulting layer of electroplated metal in this embodiment can be optionally filled, e.g., with a polymer via plug, as is known in the art. Other methods, such as many of those described for the formation of the first electrode 125, can also be used to form a conductive material as the second electrode 135 in the remaining portion of the via 105 left unfilled by the dielectric layer 130.

Figure 1E:
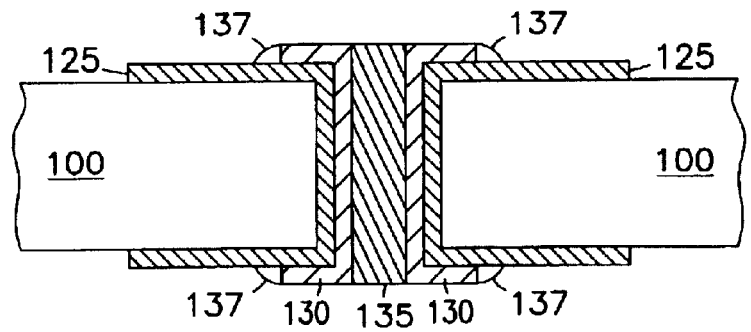

In FIG. 1E, an excess portion of the second electrode 135 is removed, if necessary, to provide separation of the first electrode 125 from the second electrode 135. For one embodiment, removal of the excess portion of the second electrode 135 includes chemical-mechanical planarization (CMP) to physically abrade away the material. Removing the excess portion of the second electrode 135 may include removing a portion of the dielectric layer 130 overlying the first surface 115 or the second surface 120. While it is desired to maintain at least a portion of the dielectric layer 130 overlying the first surface 115 and the second surface 120, in order to reduce the likelihood of bridging or shorting between the first electrode 125 and the second electrode 135, it is not required. Furthermore, removing the excess portion of the second electrode 135 may include removing all material overlying the second surface 120, i.e., those portions of the first electrode 125, dielectric layer 130 and second electrode 135 overlying the second surface 120. As shown in FIG. 1E, removal of the excess portion of the second electrode 135 may leave separated portions 137 on the surface of the first electrode 125. However, any such separated portions 137 of the second electrode 135 are not a concern as they are separated from the second electrode 135 by the dielectric layer 130 and they do not interfere with the function of the first electrode 125.

Figure 1F:
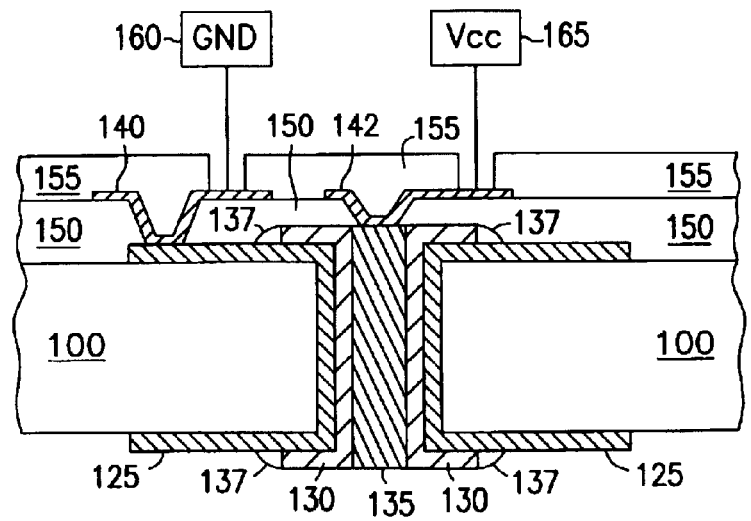

In FIG. 1F, a first insulating layer 150 is formed overlying the first electrode 125, the dielectric layer 130 and the second electrode 135, and patterned to expose a portion of the first electrode 125 and a portion of the second electrode 135. Contacts 140, 142 are formed to couple to the exposed portions of the first electrode 125 and the second electrode 135, respectively. While the contacts 140, 142 are both formed adjacent the first surface 115 in FIG. 1F, one or both could alternatively be coupled to its respective electrode adjacent the second surface 120. A second insulating layer 155 is formed overlying the contacts 140 and the first insulating layer 150, and patterned to expose a portion of contact 140 and a portion of contact 142. The exposed portion of contact 140 is coupled to a first potential source, such as a ground potential 160, and the exposed portion of the contact 142 is coupled to a second potential source, such as a supply potential $V_{cc}$ 165. While the resulting self-aligned coaxial capacitor 170 is adapted for decoupling or power dampening applications in this configuration, as previously described, the capacitor 170 can be used in any electronic device application.

Figure 2:
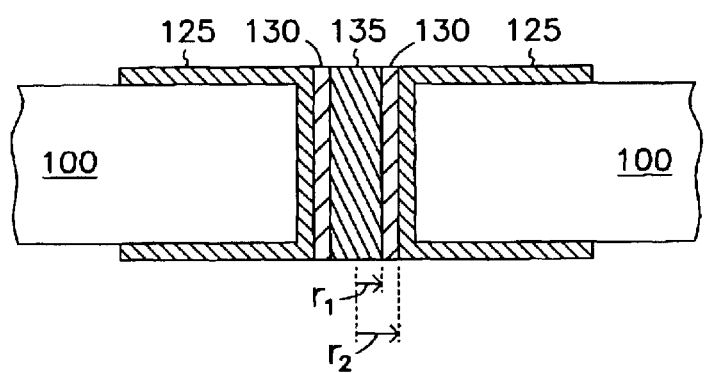
FIG. 2 is a cross-sectional view of a self-aligned coaxial capacitor.

The capacitance of capacitor 170 can be estimated using the following formula (with reference to FIG. 2):

$$C = \frac{2*\pi*\varepsilon_r*\varepsilon_0}{\ln\left(\frac{r_2}{r_1}\right)} * L$$

where: $\varepsilon_r$=permittivity constant (8.854×10$^{-12}$ F/m)
$\varepsilon_0$=dielectric constant of dielectric material
$r_2$=distance from the center of the coaxial structure to the first electrode
$r_1$=radius of the second electrode ($r_2-r_1$=thickness of the dielectric layer)
L=length of via in meters As the power and frequency requirements of microprocessors increase, the capacitance requirements for decoupling and power dampening also increase. A capacitor formed in accordance with the foregoing embodiments will generally be grossly undersized for such application on its own. However, the increasing complexity of microprocessor packages brings with it an increasing number of vias and through holes in the design of supporting substrates. As an example, a modem microprocessor package may have over 12,000 plated vias averaging 150 μm in diameter (after plating) and 30 μm in length as well as approximately 2000 plated through holes averaging 250 μm in diameter (after plating) and 800 μm in length. With each of the plated vias and through holes coupled to the supply and ground potentials as described above, they form a parallel capacitance and are thus additive. The combined capacitance for the microprocessor package can be adjusted to any desired value by controlling the dielectric thickness, the dielectric material, and the number of vias utilized as capacitors. For example, using a tantalum oxide dielectric material having a dielectric constant of approximately 25 and a dielectric thickness of approximately 0.1 μm in all plated vias and plated through holes, a combined capacitance of approximately 3 μF can be obtained for this example microprocessor package. As a further example, using a BST dielectric material having a dielectric constant of approximately 500, and a dielectric thickness of approximately 0.05 μm in the plated vias and approximately 0.30 μm in the plated through holes, a combined capacitance of approximately 34 μF can be obtained for this example microprocessor package.

While the foregoing embodiments described the formation of a capacitor in a via having openings on both sides of a substrate, blind vias extend only partially through a substrate. FIGS. 3A–3F depict an embodiment of a coaxial via capacitor formed in a blind via. By subsequent formation of an overlying layer of the substrate, the blind via becomes a buried via. The guidelines for materials and methods of forming individual layers are generally as provided above with reference to FIGS. 1A–1F. Exceptions will be noted.

Figure 3A:
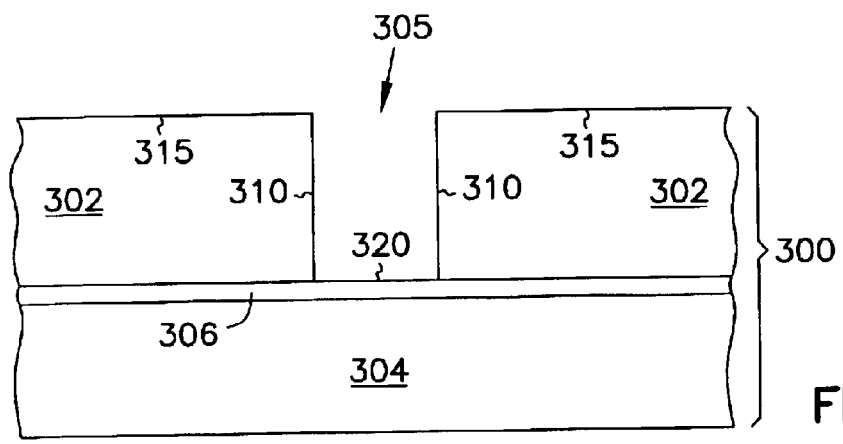
FIGS. 3A–3F are cross-sectional views of a self-aligned coaxial capacitor at various processing stages.

FIG. 3A depicts a via 305. Via 305 extends through at least one layer 302 of a substrate 300, but does not extend through the substrate 300. Via 305 terminates at a second layer 304 of the substrate 300, exposing at least a portion of a metal or other conductive run 306. Layer 302 may represent more than one layer of the substrate 300. Likewise, layer 304 may represent more than one layer of the substrate 300.

Via 305 has sidewalls 310, defined by the layer 302 of the substrate 300, and extends from a first surface 315 of the substrate 300 to a second surface 320 of the substrate 300. The first surface 315 extends outwardly from the sidewalls 310. The second surface 320 extends inwardly from the sidewalls 310. Via 305 is formed in a manner known in the art for forming an opening in a substrate. Examples include laser drilling and mechanical drilling. For purposes of this description, the second surface 320 will be presumed to be substantially planar. However, formation techniques used to form via 305 may result in a second surface 320 that is non-planar, such as concave or conical.

Figure 3B:
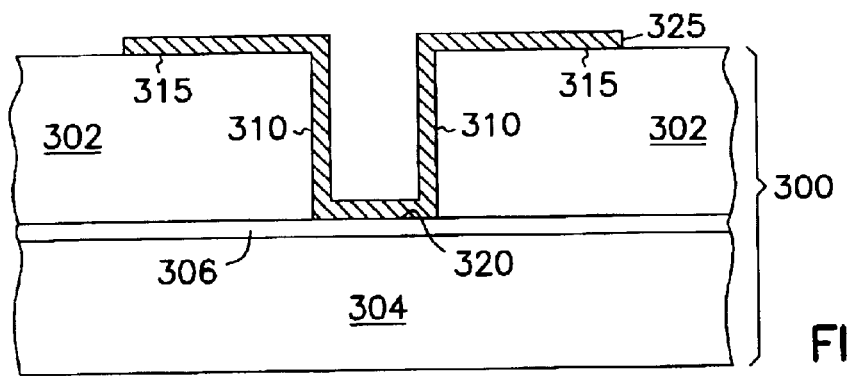

In FIG. 3B, a first electrode 325 is formed overlying the sidewalls 310 and the second surface 320 for one embodiment. For another embodiment, the first electrode 325 is formed overlying the sidewalls 310, but leaving exposed a portion of the second surface 320. Such an embodiment may be obtained by forming the first electrode 325 prior to lamination of the layers 302 and 304.

The first electrode 325 further extends to overlie at least a portion of the first surface 315. The first electrode 325 is generally formed as part of the standard processing for forming a via 305. In the use of via 305, the first electrode 325 is generally used to connect circuitry on the first surface 315 to circuitry coupled to conductive run 306. In addition, or in the alternative, the first electrode 325 may be used to connect circuitry on the first surface 315 to circuitry on various intermediate layers between the first surface 315 and the second surface 320 through additional conductive runs. For one embodiment, the first electrode 325 contains copper (Cu).

Figure 3C:
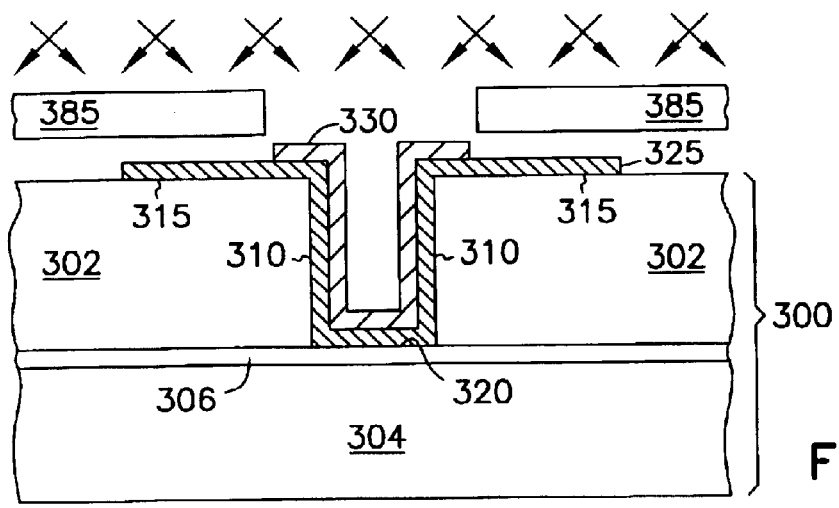

In FIG. 3C, a dielectric layer 330 is formed containing a dielectric material. The dielectric layer 330 is formed to overlie at least a first portion of the first electrode 325, the first portion of the first electrode 325 being that portion within the sidewalls 310. Furthermore, the dielectric layer 330 is formed to leave a remaining portion of the via 305 unfilled. As shown in FIG. 3C, the dielectric layer 330 may extend to overlie a second portion of the first electrode 325 overlying a portion of the first surface 315. Extension of the dielectric layer 330 over the second portion of the first electrode 325 provides certain advantages relating to separation of the first electrode 325 from a subsequent electrode as will become apparent below. However, at least a portion of the first electrode 325 on the first surface 315 remains uncovered by the dielectric layer 330. For one embodiment, the dielectric layer 330 may be formed using physical vapor deposition and defined by a shadow mask 385 as described above with reference to FIG. 1C. Alternate embodiments utilize other dielectric materials and their deposition techniques as described above with reference to the dielectric layer 130.

Figure 3D:
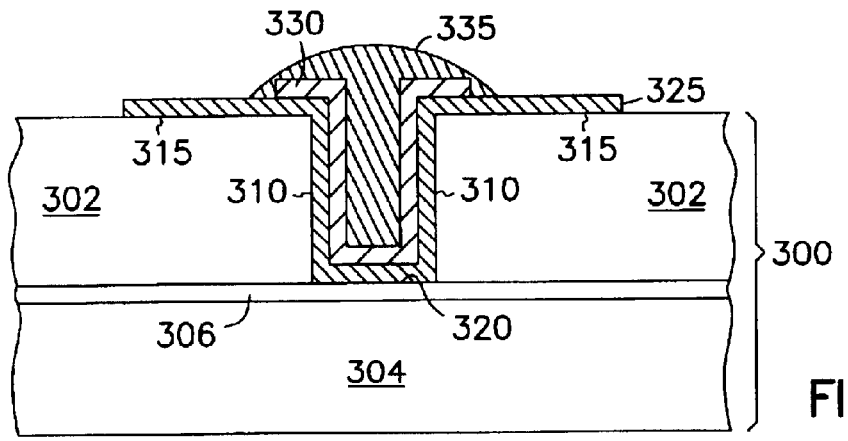

In FIG. 3D, a second electrode 335 is formed in the remaining portion of the via 305 not filled by the dielectric layer 330. The second electrode 335 is formed, in one embodiment, by filling the remaining portion of the via 305 with a conductive paste. For one embodiment, the conductive paste is cured.

Alternatively, electroless plating followed by electrolytic plating of metal, such as copper, can be used for one embodiment to form a layer of electroplated metal overlying the dielectric layer 330 as the second electrode 335. In this embodiment, the second electrode 335 will have generally a hollow structure defined by the structure of the remaining portion of the via 305 left unfilled by the dielectric layer 330, and may completely fill the remaining portion of the via 305. Any portion of the via 305 unfilled by the resulting layer of electroplated metal in this embodiment can be optionally filled, e.g., with a polymer via plug, as is known in the art. Other methods, such as many of those described with reference to the formation of the first electrode 125, can be used to form a conductive material as the second electrode 335 in the remaining portion of the via 305 left unfilled by the dielectric layer 330.

Figure 3E:
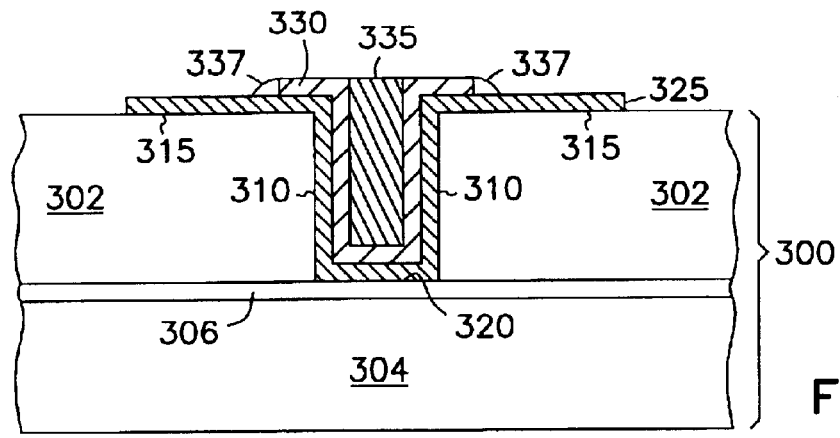

In FIG. 3E, an excess portion of the second electrode 335 is removed, if necessary, to provide separation of the first electrode 325 from the second electrode 335. For one embodiment, removal of the excess portion of the second electrode 335 includes chemical-mechanical planarization (CMP) to physically abrade away the material. Removing the excess portion of the second electrode 335 may include removing a portion of the dielectric layer 330 overlying the first surface 315. While it is desired to maintain at least a portion of the dielectric layer 330 overlying the first surface 315, in order to reduce the likelihood of bridging or shorting between the first electrode 325 and the second electrode 335, it is not required. As shown in FIG. 3E, removal of the excess portion of the second electrode 335 may leave separated portions 337 on the surface of the first electrode 325. However, any such separated portions 337 of the second electrode 335 are not a concern as they are separated from the second electrode 335 by the dielectric layer 330 and they do not interfere with the function of the first electrode 325.

Figure 3F:
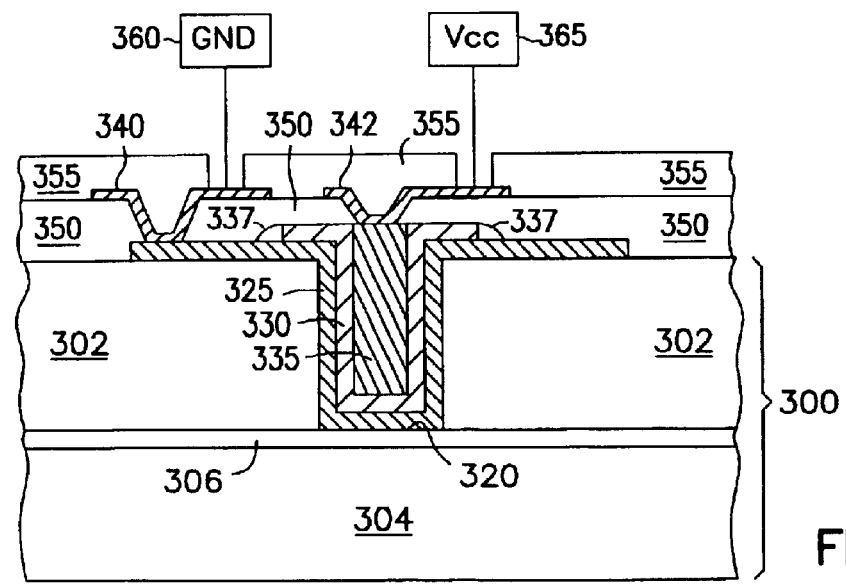

In FIG. 3F, a first insulating layer 350 is formed overlying the first electrode 325, the dielectric layer 330 and the second electrode 335, and patterned to expose a portion of the first electrode 325 and a portion of the second electrode 335. Contacts 340, 342 are formed to couple to the exposed portions of the first electrode 325 and the second electrode 335, respectively, wherein the contacts 340, 342 are both formed adjacent the first surface 315. A second insulating layer 355 is formed overlying the contacts 340, 342 and the first insulating layer 350, and patterned to expose a portion of contact 340 and a portion of contact 342. The exposed portion of contact 340 is coupled to a first potential source, such as a ground potential 360, and the exposed portion of contact 342 is coupled to a second potential source, such as a supply potential $V_{cc}$ 365. While the resulting self-aligned coaxial capacitor 370 is adapted for decoupling or power dampening applications in this configuration, as previously described, the capacitor 370 can be used in any electronic device application.

Various embodiments of coaxial capacitors formed in vias have been described. The various embodiments are self-aligned in that the opening defining the second electrode is substantially centered in the via by the nature of the deposition of the first electrode and dielectric layers. This self-aligning nature distinguishes the foregoing embodiments from capacitors formed in vias using a process of filling a plated via with a dielectric material, subsequently removing a portion of the dielectric material by drilling an opening through the dielectric material, and forming the second electrode in that opening. The self-aligned coaxial capacitor requires fewer process stages in many applications as it can be used to form thousands of capacitors simultaneously, whereas drilling an opening through a dielectric material will generally be restricted to less than about 20 at a time. The self-aligned coaxial capacitor can be formed with thinner dielectric layers, thereby permitting higher levels of capacitance for a given via diameter. The deposition techniques described herein further permit more control over the ultimate thickness of the dielectric layer, thus permitting greater degrees of freedom in the design of the integrated circuit. Because the second electrode of the various embodiments tends to be more centered than is practical with openings drilled in a dielectric material, reduced process variability is possible which allows for tighter design tolerances and resulting gains in performance and reliability. Registration accuracy of laser or mechanical drilling is currently on the order of approximately 20 μm, thus limiting the dielectric thickness to no less than about 20 μm. Accordingly, the self-aligned coaxial capacitors of the various embodiments are capable of inductance values on the order of one to two orders of magnitude less than capacitors formed by drilling an opening in a dielectric material.

The coaxial capacitors of the various embodiments are suited for use in decoupling and power dampening applications. For such applications, it is generally expected that a plurality of coaxial capacitors, often numbering in the thousands, will be coupled in parallel in order to achieve the desired level of capacitance. By forming the capacitors in vias, substantially no additional substrate real estate, i.e., surface area, is required.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A capacitor, comprising:
   a via having sidewalls defined by a substrate and extending from a first surface of the substrate to a second surface of the substrate, wherein the first surface extends outwardly from the sidewalls;
   a first electrode overlying the sidewalls of the via and at least a portion of the first surface of the substrate;
   a dielectric layer formed to overlie at least a first portion of the first electrode and to leave a remaining portion of the via unfilled, wherein the first portion of the first electrode is within the sidewalls; and
   a second electrode formed in the remaining portion of the via.

2. The capacitor of claim 1, wherein the first electrode comprises copper and the dielectric layer comprises tantalum oxide.

3. The capacitor of claim 1, wherein the dielectric layer further overlies a second portion of the first electrode overlying the first surface.

4. The capacitor of claim 1, further comprising:
   a first contact coupled to the first electrode and to a first potential source; and
   a second contact coupled to the second electrode and to a second potential source.

5. The capacitor of claim 1, wherein the substrate is selected from the group consisting of an organic substrate and a ceramic substrate.

6. The capacitor of claim 1, wherein the substrate comprises more than one layer.

7. A capacitor, comprising:
   a via having sidewalls defined by a substrate and extending from a first surface of the substrate to a second surface of the substrate, wherein the first surface extends outwardly from the sidewalls;
   a first electrode overlying the sidewalls of the via and at least a portion of the first and second surfaces of the substrate;
   a dielectric layer deposited to overlie at least a first portion of the first electrode and to leave a remaining portion of the via unfilled, wherein the first portion of the first electrode is within the sidewalls; and a second electrode formed in the remaining portion of the via.

8. The capacitor of claim 7, wherein the second surface of the substrate extends outwardly from the sidewalls.

9. The capacitor of claim 7, wherein the dielectric layer further overlies a second portion of the first electrode overlying the first surface.

10. A capacitor, comprising:
a via having sidewalls defined by a substrate and extending from a first surface of the substrate to a second surface of the substrate, wherein the first surface and the second surface extend outwardly from the sidewalls;
a first electrode overlying the sidewalls of the via and at least a portion of the first and second surfaces of the substrate;
a dielectric layer overlying at least a first portion of the first electrode, wherein the first portion of the first electrode extends from the first surface to the second surface, and wherein formation of the dielectric layer leaves a portion of the via unfilled without removal of a portion of the dielectric layer; and a second electrode formed in the portion of the via left unfilled by the dielectric layer.

11. The capacitor of claim 10, wherein the dielectric layer includes a metal oxide dielectric.

12. The capacitor of claim 10, wherein the substrate is selected from the group consisting of an organic substrate and a ceramic substrate.

13. A method of forming a capacitor, comprising:
forming a first electrode layer overlying sidewalls of a via and at least a portion of a first surface of a substrate and a second surface of the substrate, wherein the sidewalls of the via are defined by a portion of the substrate extending from the first surface to the second surface, and wherein the first surface extends outwardly from the sidewalls;
forming a dielectric layer overlying at least a first portion of the first electrode layer while leaving a portion of the via unfilled, wherein the first portion of the first electrode layer is within the sidewalls; and
forming a second electrode, wherein forming the second electrode comprises forming a conductive material in the portion of the via left unfilled by the dielectric layer.

14. The method of claim 13, wherein the method further includes subjecting the dielectric layer subsequent to deposition to a densification process at temperatures ranging from about 700° C. to about 1000° C.

15. The method of claim 13, wherein the method further includes forming a first contact to the first electrode and a second contact to the second electrode, the first and second contacts formed on opposite surfaces of the substrate.

16. A method of forming a capacitor, comprising:
forming a first electrode layer overlying sidewalls of a via and at least a portion of a first surface of a substrate and a second surface of the substrate, wherein the sidewalls of the via are defined by a portion of the substrate extending from the first surface to the second surface, and wherein the first surface and the second surface extend outwardly from the sidewalls;
forming a dielectric layer overlying at least a first portion of the first electrode layer while leaving a portion of the via unfilled, wherein the first portion of the first electrode layer is within the sidewalls; and
forming a second electrode overlying the dielectric layer.

17. The method of claim 16, wherein the method further includes forming an adhesion layer on the first electrode layer prior to forming the dielectric layer.

18. The method of claim 16, wherein forming a second electrode overlying the dielectric layer includes forming a shadow mask and depositing a metal by physical vapor deposition in areas not covered by the shadow mask.

19. A method of forming a capacitor, comprising:
forming a first electrode layer overlying sidewalls of a via, at least a portion of a first surface of a substrate, and a second surface of the substrate, wherein the sidewalls of the via are defined by a portion of the substrate extending from the first surface to the second surface, and wherein the first surface extends outwardly from the sidewalls and the second surface extends inwardly from the sidewalls;
forming a dielectric layer overlying at least a first portion of the first electrode layer while leaving a portion of the via unfilled, wherein the first portion of the first electrode layer is within the sidewalls; and
forming a second electrode, wherein forming the second electrode comprises forming a conductive material in the portion of the via left unfilled by the dielectric layer.

20. The method of claim 19, further comprising:
forming a first contact coupled to the first electrode; and
forming a second contact coupled to the second electrode.

21. The method of claim 19, wherein forming a first electrode layer includes forming a first electrode layer on a organic substrate.

22. A method of forming a capacitor, comprising:
forming a first metal seed layer overlying sidewalls of a via and at least a portion of a first surface of a substrate, wherein the sidewalls of the via are defined by a portion of the substrate extending from the first surface to a second surface of the substrate, and wherein the first surface extends outwardly from the sidewalls;
electrolytically plating a layer of second metal on the first metal seed layer, thereby forming a first electrode;
depositing a layer of third metal overlying at least a first portion of the first electrode while leaving a portion of the via unfilled, wherein the first portion of the first electrode is within the sidewalls;
anodizing the layer of third metal, thereby forming a dielectric layer; filling the portion of the via left unfilled by the layer of third metal with a conductive paste, thereby forming a second electrode; and
removing excess conductive paste to separate the second electrode from the first electrode.

23. The method of claim 22, wherein the first metal seed layer and the first electrode further overlie at least a portion of the second surface of the substrate.

24. The method of claim 22, wherein the second surface of the substrate extends outwardly from the sidewalls.

25. A method of forming a capacitor, comprising:
forming a copper seed layer overlying sidewalls of a via and at least a portion of a first surface of a substrate, wherein the sidewalls of the via are defined by a portion of the substrate extending from the first surface to a second surface of the substrate, and wherein the first surface extends outwardly from the sidewalls;
electrolytically plating a layer of copper on the copper seed layer, thereby forming a first electrode;
depositing a layer of tantalum overlying at least a first portion of the first electrode while leaving a portion of the via unfilled, wherein the first portion of the first electrode is within the sidewalls;
anodizing the layer of tantalum, thereby forming a tantalum oxide dielectric layer;

filling the portion of the via left unfilled by the layer of third metal with a conductive paste, thereby forming a second electrode; and removing excess conductive paste to separate the second electrode from the first electrode.

26. The method of claim 25, wherein the method further includes curing the conductive paste.

27. The method of claim 25, wherein forming a copper seed layer includes electroless-depositing the copper seed layer.

28. A method of operating an electronic device, comprising:

coupling a first electrode for each of a plurality of capacitors to a first potential; and coupling a second electrode for each of the plurality of capacitors to a second potential, wherein each of the plurality of capacitors is a self-aligned coaxial capacitor formed in one of a plurality of vias of a substrate supporting the electronic device in a one-to-one relationship to the plurality of vias.

29. The method of claim 28, wherein the method further includes coupling the first electrode to ground and the second electrode to a power supply.

30. The method of claim 28, wherein the method further includes adjusting the package capacitance of the electronic device by controlling the plurality of self-aligned coaxial capacitors and controlling a dielectric composition and a dielectric layer thickness for the plurality of self-aligned coaxial capacitors.

31. An electronic device, comprising:

a first potential source;

a second potential source; and at least one capacitor comprising:

a via having sidewalls defined by a substrate and extending from a first surface of the substrate to a second surface of the substrate, wherein the first surface extends outwardly from the sidewalls;

a first electrode overlying the sidewalls of the via and at least a portion of the first surface of the substrate;

a dielectric layer formed to overlie at least a first portion of the first electrode and to leave a remaining portion of the via unfilled, wherein the first portion of the first electrode is within the sidewalls;

a second electrode formed in the remaining portion of the via;

a first contact coupled to the first electrode and the first potential source; and a second contact coupled to the second electrode and the second potential source.

32. The electronic device of claim 31, wherein the substrate is selected from the group consisting of an organic substrate and a ceramic substrate.

33. The electronic device of claim 31, wherein the dielectric layer includes a metal oxide dielectric.

34. An electronic device, comprising:

a first potential source;

a second potential source; and at least one capacitor comprising:

a via having sidewalls defined by a substrate and extending from a first surface of the substrate to a second surface of the substrate, wherein the first surface extends outwardly from the sidewalls;

a first electrode overlying the sidewalls of the via and at least a portion of the first and second surfaces of the substrate;

a dielectric layer overlying at least a first portion of the first electrode, wherein the first portion of the first electrode is within the sidewalls, and wherein formation of the dielectric layer leaves a portion of the via unfilled without subsequent removal of a portion of the dielectric layer;

a second electrode formed in the portion of the via left unfilled by the dielectric layer;

a first contact coupled to the first electrode and the first potential source; and a second contact coupled to the second electrode and the second potential source.

35. The electronic device of claim 34, wherein the substrate is selected from the group consisting of an organic substrate and a ceramic substrate.

36. The electronic device of claim 34, wherein the first electrode includes copper and the dielectric layer includes a metal oxide dielectric.

* * * * *

UNITED STATES PATENT AND TRADEMARK OFFICE
CERTIFICATE OF CORRECTION

PATENT NO. : 6,963,483 B2
DATED : November 8, 2005
INVENTOR(S) : Chakravorty et al.

It is certified that error appears in the above-identified patent and that said Letters Patent is hereby corrected as shown below:

Title page,
Item [56], References Cited, U.S. PATENT DOCUMENTS,
Below "5,219,787 A 6/1993 Carey et al. 437/187" insert -- 5,509,200 4/1996 Frankeny et al. --.
Below "5,583,739 A * 12/1996 Vu et al. 361/313" insert -- 5,745,333 4/1998 Frankeny et al. --.
Below "5,973,910 A* 10/1999 Gardner 361/313" insert -- 6,098,282 8/2000 Frankeny et al. --.
FOREIGN PATENT DOCUMENTS,
Below "JP 10163632 6/1998 H05K/3/46" insert -- WO-01/50823A1 7/2001 --.

Signed and Sealed this

Twenty-first Day of February, 2006

JON W. DUDAS
*Director of the United States Patent and Trademark Office*